United States Patent
Chu et al.

(10) Patent No.: US 6,366,462 B1
(45) Date of Patent: Apr. 2, 2002

(54) ELECTRONIC MODULE WITH INTEGRAL REFRIGERANT EVAPORATOR ASSEMBLY AND CONTROL SYSTEM THEREFORE

(75) Inventors: Richard C. Chu, Poughkeepsie; Michael J. Ellsworth, Jr., Lagrangeville; Robert E. Simons, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/618,921

(22) Filed: Jul. 18, 2000

(51) Int. Cl.$^7$ ................................................ H05K 7/20
(52) U.S. Cl. ...................... 361/699; 165/80.4; 165/908; 257/714
(58) Field of Search .................... 62/259.2; 165/804, 165/104.34, 908; 174/15.1, 16.1, 16.3; 257/714–716; 361/688–689, 698–699, 701–702, 715

(56) References Cited

U.S. PATENT DOCUMENTS

| | | | |
|---|---|---|---|
| 4,750,086 A | 6/1988 | Mittal | 361/382 |
| 4,912,600 A | 3/1990 | Jaeger et al. | 361/385 |
| 5,021,924 A | 6/1991 | Kieda et al. | 361/385 |
| 5,168,348 A | 12/1992 | Chu et al. | 257/713 |
| 5,177,667 A | 1/1993 | Graham et al. | 361/385 |
| 5,183,104 A | 2/1993 | Novotny | 165/104.33 |
| 5,323,292 A | 6/1994 | Brzezinski | 361/689 |
| 5,394,299 A * | 2/1995 | Chu et al. | 361/705 |
| 5,591,789 A | 1/1997 | Iruvanti et al. | 523/515 |
| 5,604,978 A | 2/1997 | Sherif et al. | 29/840 |
| 5,774,334 A * | 6/1998 | Kawamura et al. | 361/699 |
| 5,818,692 A | 10/1998 | Denney, Jr. et al. | 361/699 |

* cited by examiner

*Primary Examiner*—Gregory Thompson
(74) *Attorney, Agent, or Firm*—Andrew J. Wojnicki, Esq.; Kevin P. Radigan, Esq.; Heslin Rothenberg Farley & Mesiti P.C.

(57) ABSTRACT

An electronic module is provided having an integrated refrigerant evaporator assembly coupled to a closed-cycle cooling system, as well as a method for controlling the system. The module and integrated assembly includes a plurality of integrated circuit chips arrayed on a substrate. The evaporator assembly is disposed over the chips and substrate such that a chamber is formed between the assembly and the substrate within which the chips reside. A lower plate of the assembly has a plurality of jet orifices which direct coolant onto individual chips of the plurality of chips arrayed on the substrate. In addition, the lower plate includes a plurality of channels formed between at least some of the jet orifices. The plurality of channels remove coolant from the chamber after the coolant has been heated by impinging upon the integrated circuit chips. A control system is provided to prevent excessive pressure from building up within the assembly at startup and shutdown of the closed-cycle cooling system.

24 Claims, 7 Drawing Sheets

US 6,366,462 B1

ELECTRONIC MODULE WITH INTEGRAL REFRIGERANT EVAPORATOR ASSEMBLY AND CONTROL SYSTEM THEREFORE

TECHNICAL FIELD

The present invention is directed to cooling assemblies and other apparatus used for removing heat from electronic devices. More particularly, it relates to a closed-cycle coolant impingement assembly integrated with an electronic module, and to a control method therefore.

BACKGROUND OF THE INVENTION

As is well known, as the circuit density of electronic chip devices increases, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause for failure of chip devices. Furthermore, it is anticipated that the demand for heat removal from these devices will increase indefinitely. Accordingly, it is seen that there is a large and significant need to provide useful cooling mechanisms for electronic devices.

DISCLOSURE OF THE INVENTION

Limitations of bulk complementary metal oxide semiconductor (CMOS) scaling will soon be reached, and other means to enhance circuit performance are being investigated. One approach is to operate circuits at low temperatures. Towards this end, a refrigeration system is proposed herein to cool, for example, the processor module or other heat generating components of a computer system. The heat produced by CMOS chips is conventionally conducted through a compliant paste gap, across an encapsulation hat, and into an evaporator of a refrigeration system. The desire to cool higher and higher powered multichip modules to lower and lower temperatures places the use of a paste encapsulated module in question. The ability of the paste to provide its function at very low temperatures is suspect, and the higher heat fluxes tend to drive more complex and costly evaporator designs. An alternate approach to cooling an electronic module is thus desirable.

Briefly summarized, in one aspect the present invention comprises an electronic module and integrated refrigerant evaporator assembly which includes a plurality of heat generating electronic components arrayed on a substrate. The evaporator assembly is disposed over the electronic components such that the electronic components reside in a chamber between the substrate and the refrigerant evaporator assembly. The refrigerant evaporator assembly is configured to direct coolant onto the plurality of heat generating electronic components, which may comprise integrated circuit chips. More particularly, the evaporator assembly includes a lower plate which has a plurality of jet orifices that are arrayed to direct coolant onto the plurality of heat generating electronic components. The lower plate further includes a plurality of channels formed between at least some of the plurality of jet orifices. The plurality of channels are designed to remove coolant from the chamber after the coolant is heated by the plurality of heat generating electronic components.

In another aspect, a closed-cycle cooling system for an electronic module is provided. The closed-cycle cooling system includes a coolant delivery and extraction system having a delivery branch and an extraction branch. A first control valve is located in the delivery branch and a second control valve is located in the extraction branch. The electronic module includes at least one heat generating electronic component disposed on a substrate, and a refrigerant evaporator assembly disposed over the at least one heat generating electronic component. The at least one heat generating electronic component resides in a chamber defined between the substrate and the evaporator assembly. The evaporator assembly is configured to direct coolant onto the at least one heat generating electronic component when in use, and has an inlet coupled to the delivery branch and an outlet coupled to the extraction branch. The closed-cycle cooling system further includes a controller for controlling the first control valve and the second control valve to limit pressure within the chamber when initiating and when discontinuing flow of coolant within the closed-cycle cooling system.

In a further aspect, control methods are provided for controlling coolant flow within the closed-cycle cooling system in order to protect the electronic module and integrated refrigerant evaporator assembly from experiencing high coolant pressure at startup and shutdown of the closed-cycle cooling system. Startup is controlled by turning the system's compressor on, and thereafter opening a control valve in the extraction branch of the closed-cycle cooling system, and subsequently opening a control valve in the delivery branch of the closed system. Pressure is controlled at shutdown by first closing the control valve in the delivery branch, waiting until coolant pressure within the assembly is less than a predetermined setpoint, then closing the control valve in the extraction branch, and thereafter turning the compressor off.

To restate, provided herein is an electronic module having an integrated jet impingement refrigerant evaporator assembly, as well as a control method therefor. Advantageously, the electronic module with integrated evaporator proposed herein is compact and has a low profile. Furthermore, since heat transfer takes place directly between a refrigerant and the semiconductor chips of the module, the evaporator can be made of lightweight, low thermal conductivity materials such as hard plastics. Materials of this type have low thermal capacitance which minimizes initial cool-down time, plus the low thermal conductivity helps to reduce parasitic heat load inherent in low temperature systems. In addition, since tolerances (with the exception of the jet orifices) are not as critical as those of today's module hardware, the cost of producing the evaporator should be relatively low. Subsections may even be molded or pressed (e.g., stamped) with minimal finishing or machining required.

Furthermore, the pressure drop across the jet orifice hat can easily be higher than conventional pump flow systems can practically provide. For example, typical centrifugal pumping systems will not tolerate much more than a 10 psi orifice pressure drop. This limits jet velocity and thus heat transfer capability. In a refrigeration system, pressure drops across expansion devices are typically more than 150 psi. This pressure drop can now be proportioned between the expansion device and the jet orifices to optimize heat transfer and still attain low refrigerant temperatures.

Additional features and advantages are realized through the techniques of the present invention. Other embodiments and aspects of the invention are described in detail herein and are considered part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

Figure 1A:
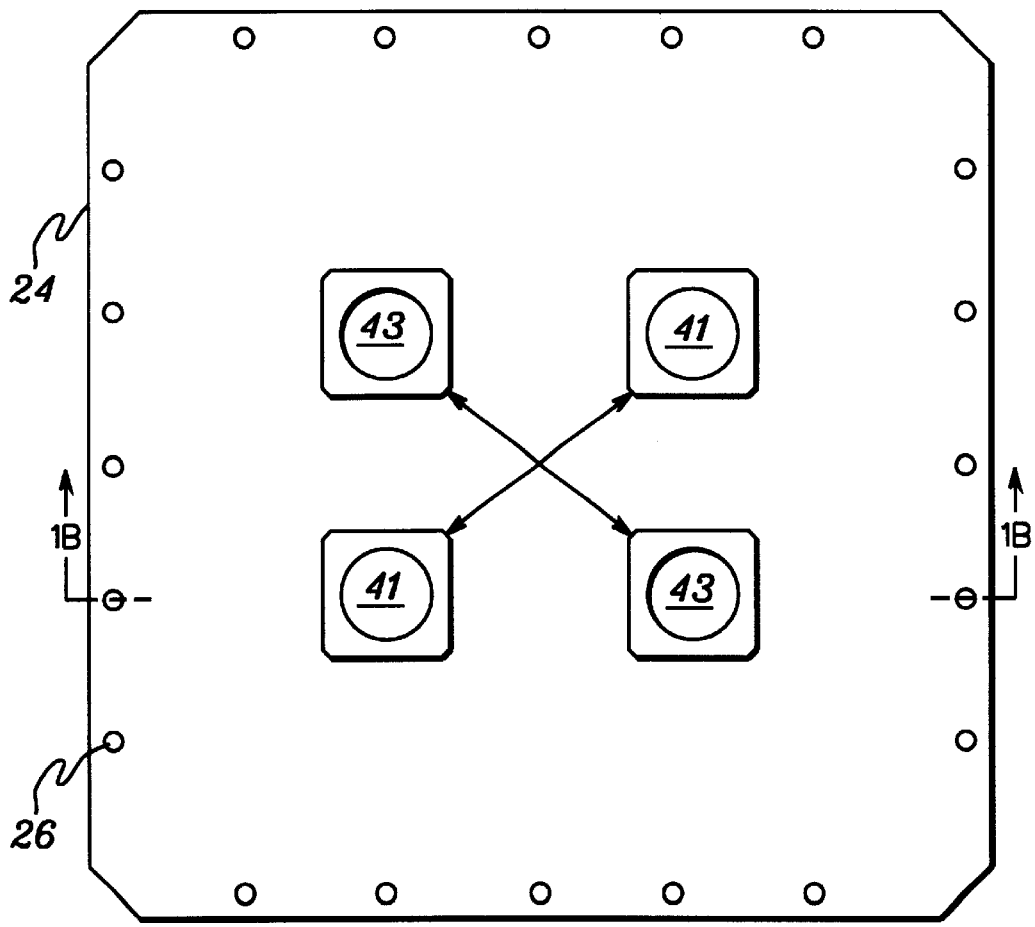
FIG. 1A is a top plan view of an electronic module and integrated refrigerant evaporator assembly in accordance with the principles of the present invention.
Figure 1B:
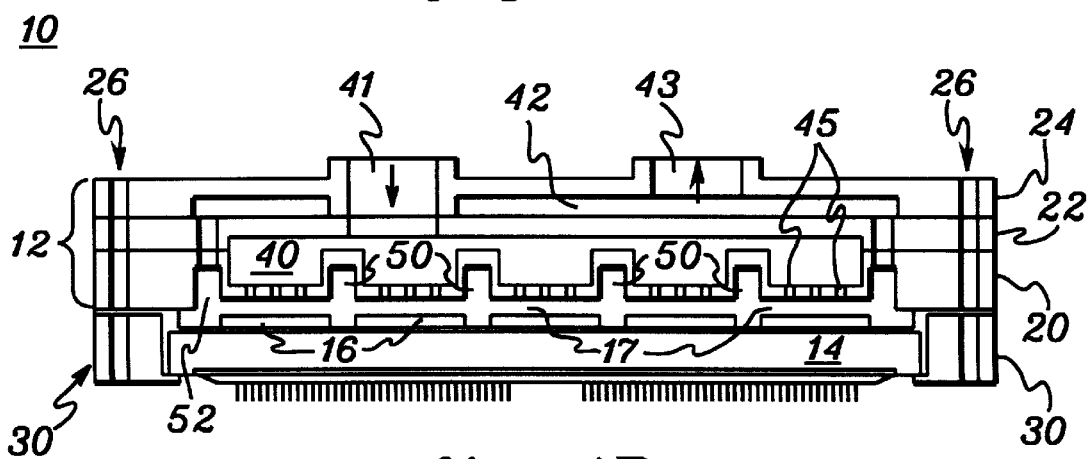
FIG. 1B is a cross-sectional elevational view of the electronic module of FIG. 1A taken along line 1B—1B.

FIGS. 1A & 1B depict one embodiment of an electronic module, generally denoted 10, having an integrated refrigerant evaporator assembly 12 in accordance with the principles of the present invention. As shown in FIG. 1B, evaporator assembly 12 resides above a substrate 14 having a plurality of chips 16 disposed thereon. Conventionally, chips 16 electrically couple to conductive planes (not shown) within substrate 14 which electrically connect to a plurality of pins on a lower surface of substrate 14. In this embodiment, a base plate 30 surrounds substrate 14 and is used to mechanically couple evaporator assembly 12 to substrate 14. A plurality of aligned openings 26 allow the plates of evaporator assembly 12 and base plate 30 to be mechanically connected, e.g., using bolts (not shown).

In this embodiment, a chamber 17 is formed between evaporator assembly 12, disposed over the plurality of integrated circuit chips 16, and substrate 14. Coolant is fed into chamber 17 through a plurality of jet orifices 45 formed in a lower plate 20 of assembly 12. The jet orifices, various embodiments of which are described further below, are disposed in plate 20 in order to impinge coolant directly onto semiconductor chips 16. The coolant is received through an inlet plenum 40 fed through one or more inlet ports 41.

Heated coolant (e.g., gaseous coolant) is advantageously removed from chamber 17 through a plurality of channels 50 formed in lower plate 20 and extending to a perimeter of the array of integrated circuit chips 16 disposed on the substrate. At the perimeter, one or more openings are formed in lower plate 20, an intermediate plate 22 and an upper plate 24 of assembly 12 which are aligned to form one or more outlet channels feeding heated coolant back to an outlet plenum 42, which is in communication with one or more outlets 43. In this embodiment, inlet plenum 40 is defined between lower plate 20 and intermediate plate 22, while outlet plenum 42 resides between intermediate plate 22 and upper plate 24. FIGS. 2A–4B depict one example of plates 20, 22 & 24 in greater detail. However, those skilled in the art will note that various other configurations can be readily conceived for the plates comprising the evaporator assembly. Further, if desired, the evaporator assembly could be fabricated as a unitary structure having the particular characteristics of the multiplate assembly of FIG. 1B.

Figure 2A:
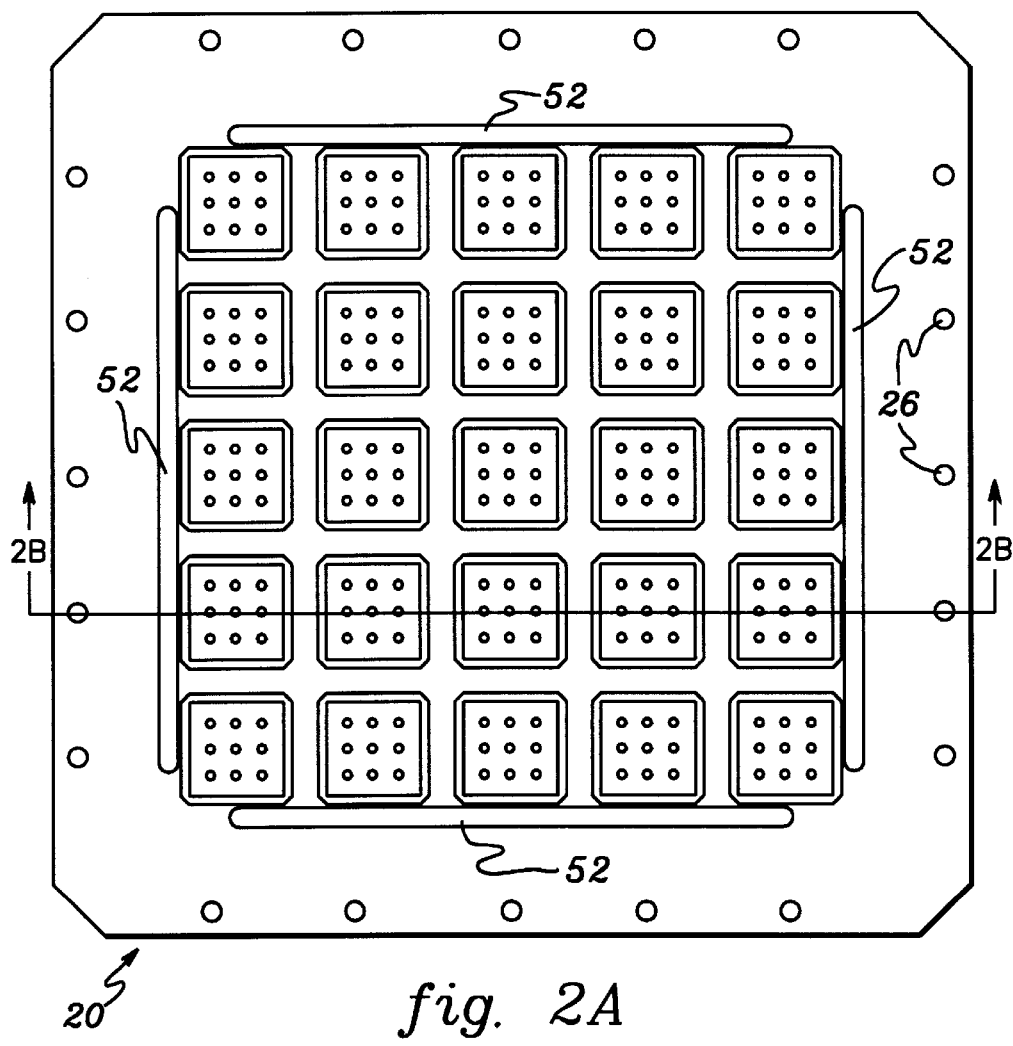
FIG. 2A is a plan view of one embodiment of a lower plate in accordance with the principles of the present invention for the evaporator assembly depicted in FIG. 1B.
Figure 2B:
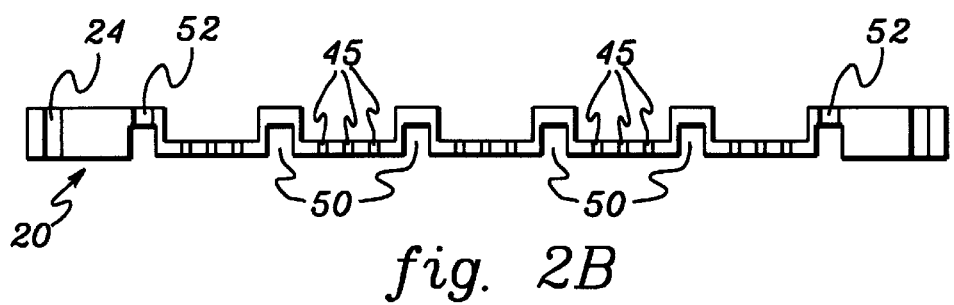
FIG. 2B is a cross-sectional elevational view of the lower plate of FIG. 2A taken along line 2B—2B.

In FIGS. 2A & 2B, one embodiment of lower plate 20 is shown. Lower plate 20 again includes a plurality of openings 26 along its periphery which are used to mechanically connect the assembly and the substrate. In this embodiment, plate 20 is provided with multiple 3×3 arrays of jet orifices 45 which are assumed to be positioned to align over respective integrated circuit chips disposed on the substrate. Holes are formed/machined in the wells of the inlet plenum to serve as the jet orifices for the refrigerant. The diameter and number of orifices 45 are chosen to optimize cooling requirements. Wells are principally provided to allow for channels 50 that allow the effluent to readily pass to the outer perimeter of the module.

Although shown in FIG. 2A as multiple 3×3 arrays, those skilled in the art will note that various combinations of jet orifices could be provided within lower plate 20. For example, if an array of integrated circuit chips disposed on a substrate comprise chips of different heat generating capacity, then additional coolant can be directed onto chips generating greater heat, while integrated circuit chips requiring less cooling can have less jet orifices arrayed over them. Thus, it is conceivable that certain integrated circuit chips may have a 3×3 array over them, while other integrated circuit chips may have a 2×2 array, or even just one or no jet orifice aligned over them. Again, this invention encompasses the concept that the individual heat generating capacity of each integrated circuit chip on a substrate be considered in configuring the jet orifices of lower plate 20. If certain chips require additional cooling, then a larger number of jet orifices are provided to align over those chips. Also, the 5×5 sets of 3×3 arrays of jet orifices of FIG. 2A is provided by way of example only, and in practice would be dependent upon the actual array of integrated circuit chips or other heat generating components disposed on the substrate.

Also shown in FIGS. 2A & 2B are channels 50 in the lower surface of plate 20 which facilitate removal of heated coolant to elongated openings 52 disposed at the periphery of the array of integrated circuit chips (see FIG. 1B). These elongated openings 52 align with similar openings in intermediate plate 22 to form an outlet channel for heated coolant to be removed to outlet plenum 42 (FIG. 1B). An x-y pattern of channels 50 is formed in lower plate 20 in between the regions of 3×3 jet orifices to facilitate removal of heated coolant to a closest outlet opening 52. The size and shape of channels 50 can vary depending upon the particular array of integrated circuit chips over which the refrigerant evaporator assembly is to be placed.

Figure 3A:
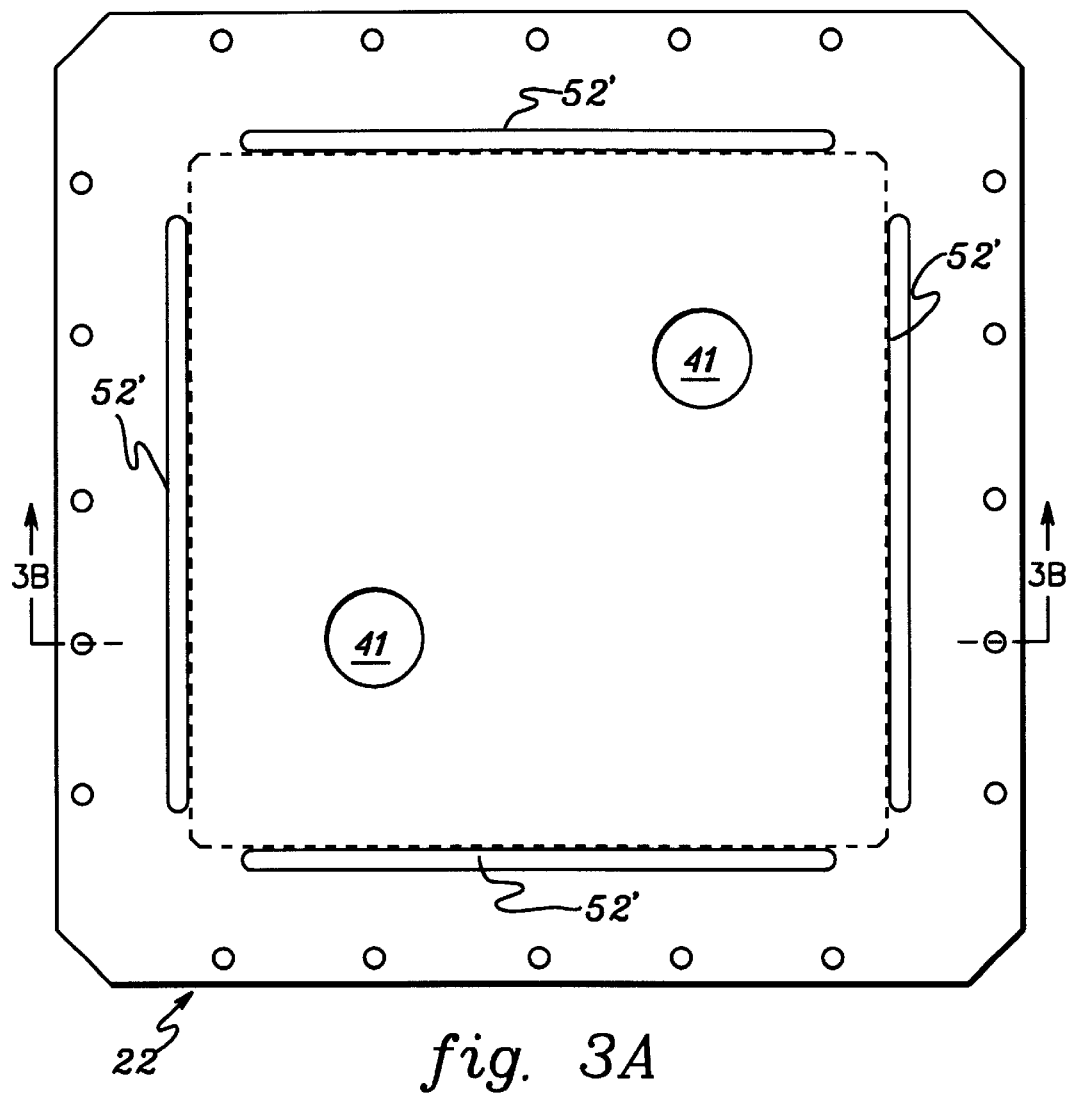
FIG. 3A is a plan view of one embodiment of a middle plate in accordance with the principles of the present invention for the evaporator assembly of FIG. 1B.
Figure 3B:
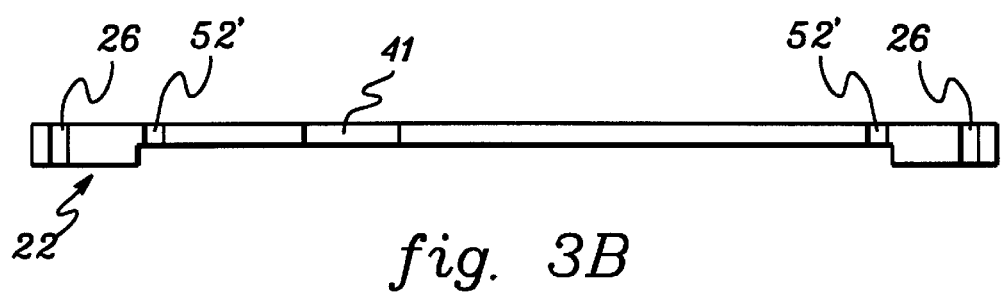
FIG. 3B is a cross-sectional elevational view of the middle plate of FIG. 3A taken along line 3B—3B.

FIGS. 3A & 3B depict one embodiment of intermediate plate 22. Plate 22 is configured to stack atop lower plate 20 (see FIGS. 2A & 2B) and has inlet ports 41 to the inlet plenum 40 formed between lower plate 20 and intermediate plate 22 (see FIG. 1B). In addition, intermediate plate 22 includes elongated openings 52' which align over elongated openings 52 in lower plate 20 to form the outlet channels. The plurality of openings 26 are disposed along a perimeter of plate 22 to facilitate mechanical connection of the evaporator assembly to the substrate.

Figure 4A:
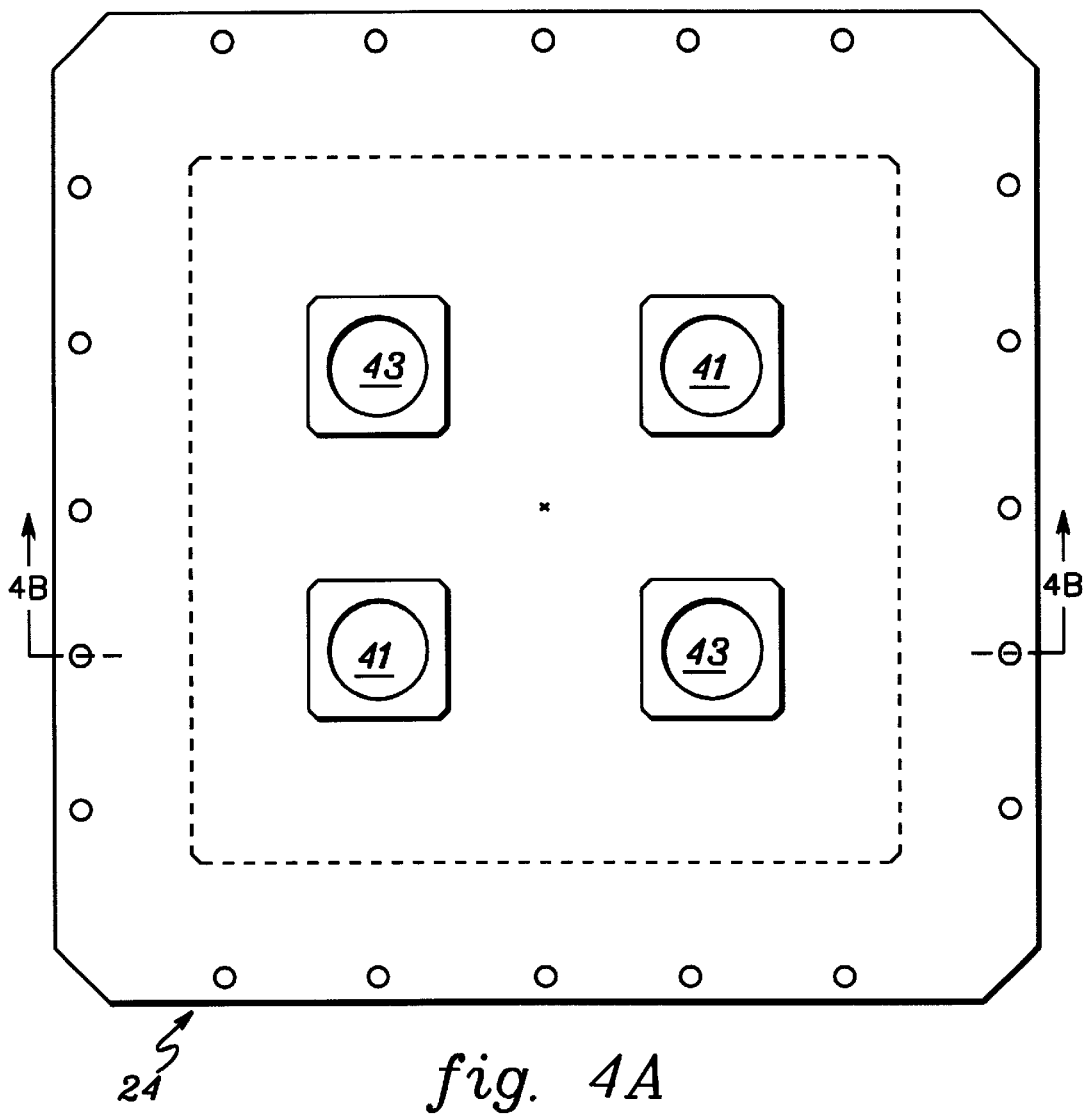
FIG. 4A is a plan view of one embodiment of an upper plate in accordance with the principles of the present invention for the evaporator assembly of FIG. 1B.
Figure 4B:
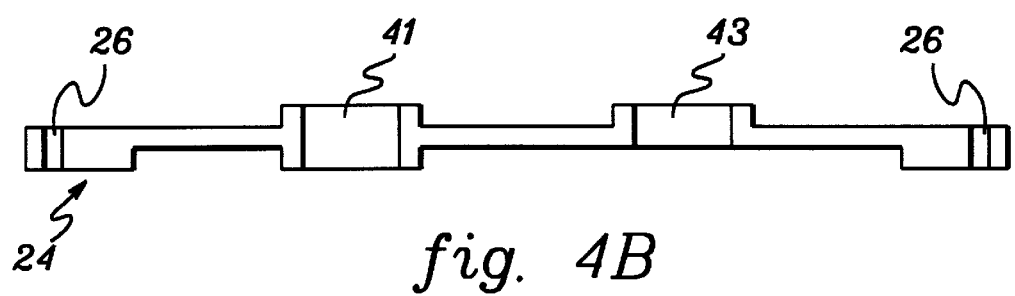
FIG. 4B is a cross-sectional elevational view of the upper plate of FIG. 4A taken along line 4B—4B.

FIGS. 4A & 4B depict one embodiment of upper plate 24 of evaporator assembly 12 (see FIG. 1B). Upper plate 24 includes two inlet ports 41 and two outlet ports 43. Two inlet and outlet ports are provided so that continuous operational redundancy associated with today's module refrigeration unit cooling systems can be maintained. Inlets 41 are in communication with inlet plenum 40 of FIG. 1B, while outlets 43 are in communication with outlet plenum 42 of FIG. 1B. A plurality of holes 26 are disposed at the perimeter of upper plate 24 to facilitate mechanical coupling of the assembly to the substrate as noted above. Outlet plenum 42 is defined between intermediate plate 22 and upper plate 24 as shown in FIG. 1B.

In one embodiment, the coolant employed in the assembly comprises a refrigerant. Refrigerants commonly used in medium (down to $-40°$ C.) and low (down to $-100°$ C.) temperature applications are chemically inert dielectric fluids suitable for direct contact with materials typically used in packaged integrated circuit chips today. It is therefore proposed herein to impinge the refrigerant directly onto the integrated circuit chips (for example, processor chips), using the integrated evaporator assembly of FIG. 1B. The substrate carrying the semiconductor chips to be cooled is sandwiched between a base plate and the jet impingement evaporator in a same manner as the substrate is today sandwiched between a base plate and a thermally conducting hat.

In operation, refrigerant enters the evaporator assembly and distributes itself within the inlet plenum and then passes through the jet orifices where it impinges on the semiconductor chips, thus cooling the chips. The effluent makes its way through the channels to the outer perimeter of the substrate and then upward through the four effluent slots to the outlet plenum, and then exits through the outlet ports. In one embodiment, the refrigerant comprises a liquid when introduced through the jet orifices and undergoes heating to become a gaseous-coolant after impinging upon the semiconductor chips. The gaseous-coolant is then removed through the plurality of channels 50 (see FIG. 1B) formed in the lower plate of the assembly.

Figure 5A:
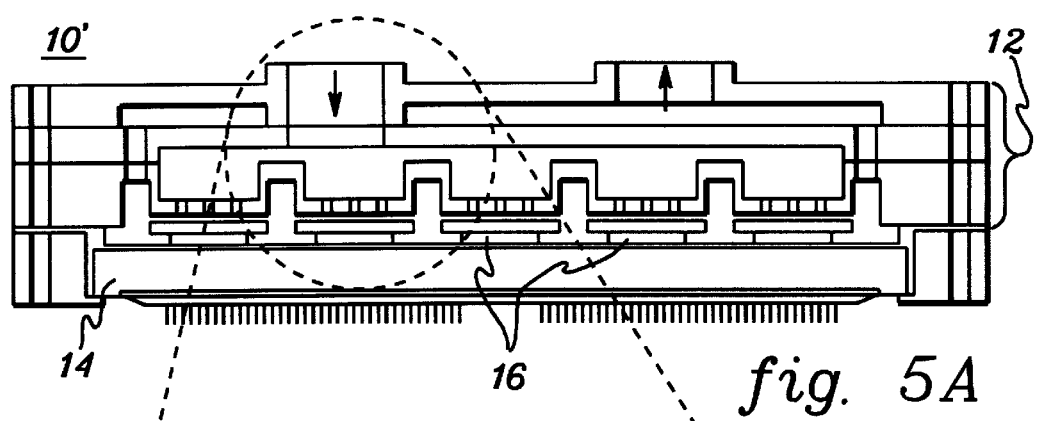
FIG. 5A is an elevational view of an alternate embodiment of an electronic module having an integrated refrigerant evaporator assembly in accordance with the principles of the present invention.
Figure 5B:
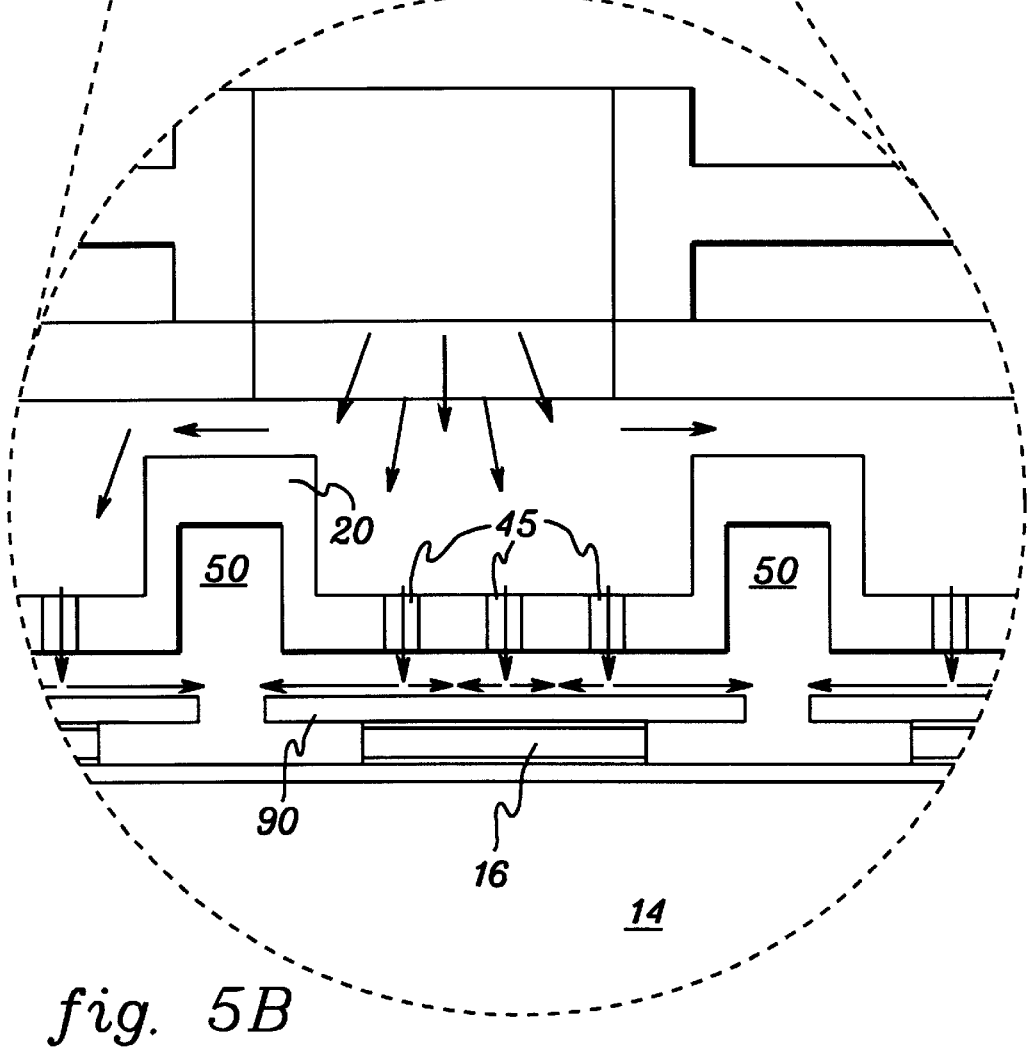
FIG. 5B is an enlargement of a portion of the electronic module of FIG. 5A showing use of a thermal spreader over each integrated circuit chip disposed in the module.

FIGS. 5A & 5B depict an alternate embodiment of an electronic module 10' employing an evaporator assembly 12 in accordance with the principles of the present invention. Module 10' again includes a substrate 14 upon which one or more integrated circuit chips 16 are arrayed. As shown in the enlargement of FIG. 5B, thermal spreaders 90 are thermally coupled to exposed planar surfaces of the integrated circuit chips within the module. Each thermal spreader 90 is positioned such that the jet orifices are in opposing relation therewith, with coolant passing through the jet orifices impinging upon a main surface thereof. Essentially, thermal spreaders 90 enlarge the area which coolant may contact, thereby facilitating cooling of the semiconductor chips themselves. Heated coolant (for example, gaseous-coolant) is again removed through channels 50 in a manner similar to that described above. Note that thermal coupling between semiconductor chips 16 and thermal spreader 90 can be accomplished in any conventional manner, for example, a solder interface or an adhesive (e.g., epoxy) could be employed. For example, 4–20 mils of Eutectic PbSn solder might be used.

Thermal spreader plate 90 may comprise a monolithic piece of high thermal conductivity material. The high thermal conductivity of the spreader makes it an effective extended surface for heat transfer thus spreading the heat flow and concomitantly, lowering temperatures. More particularly, the plates can be made of high thermal conductivity metal such as copper, or high thermal conductivity ceramic such as aluminum nitride. The thermal spreader plate acts as a fin to provide increased surface area over which to transfer heat from the chip to the refrigerant jets. This further reduces chip operating temperatures below what they would be with refrigerant jets directly impinging upon the back surface of the chips.

Figure 6:
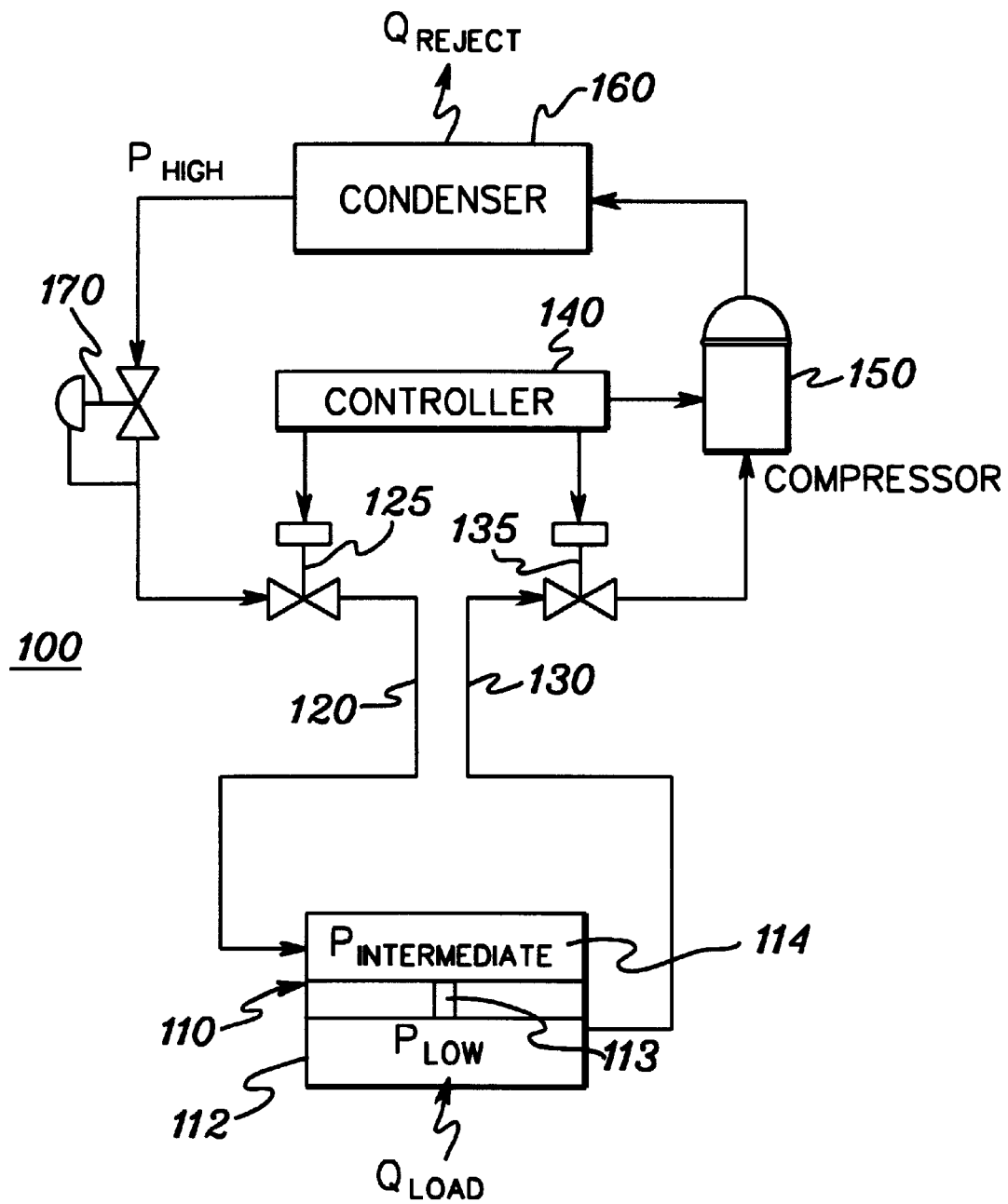
FIG. 6 depicts one embodiment of a closed-cycle cooling system in accordance with the principles of the present invention.

FIG. 6 depicts one embodiment of a closed-cycle cooling system in accordance with another aspect of the present invention. System 100 includes an electronic module 110 having an integrated refrigerant evaporator assembly such as depicted in FIGS. 1B or 5B. As a simplified representation, module 110 is shown in FIG. 6 to include an inlet plenum 114 which contains coolant to be provided through one or more jet orifices 113 to a chamber 112 within which one or more heat generating components, such as one or more integrated circuit chips, reside. A delivery branch 120 of system 100 provides coolant to the integrated assembly, while an extraction branch 130 removes gaseous-coolant from the assembly. In this embodiment, a first control valve 125 resides in delivery branch 120, while a second control valve 135 resides in extraction branch 130. A controller 140 is coupled to first control valve 125 and second control valve 135 and controls the opening and closing thereof in accordance with the present invention.

Controller 140 also controls turn on and turn off of a compressor 150 which recompresses gaseous-coolant received through extraction branch 130, and forwards the recompressed gas to a condenser 160. Condenser 160 converts the gaseous-coolant back to liquid coolant with heat $Q_{reject}$ being extracted. Output from condenser 160 is a high pressure coolant $P_{high}$ which is fed to a pressure regulating expansion valve 170. Pressure regulating expansion valve 170 achieves a cooling effect on the liquid coolant and reduces the pressure to $P_{intermediate}$, which is the pressure within the inlet plenum of assembly 110. The desired pressure within chamber 112 where the heat load $Q_{load}$ resides is defined as $P_{low}$. Table 1 presents typical pressure levels for $P_{low}$, $P_{intermediate}$ and $P_{high}$. Presented herein is a control technique to ensure that chamber 112 does not become over pressurized particularly at startup and shutdown of system 110.

TABLE 1

Typical Pressure Levels

| Status | $P_{low}$ (psia) | $P_{intermediate}$ (psia) | $P_{high}$ (psia) |
|---|---|---|---|
| System On | 8–20 | 28–40 | 150–175 |
| System Off | <30 | <30 | 100–150 |
| $P_{setpoint}$ = ~15–20 psia | | | |

Figure 7A:
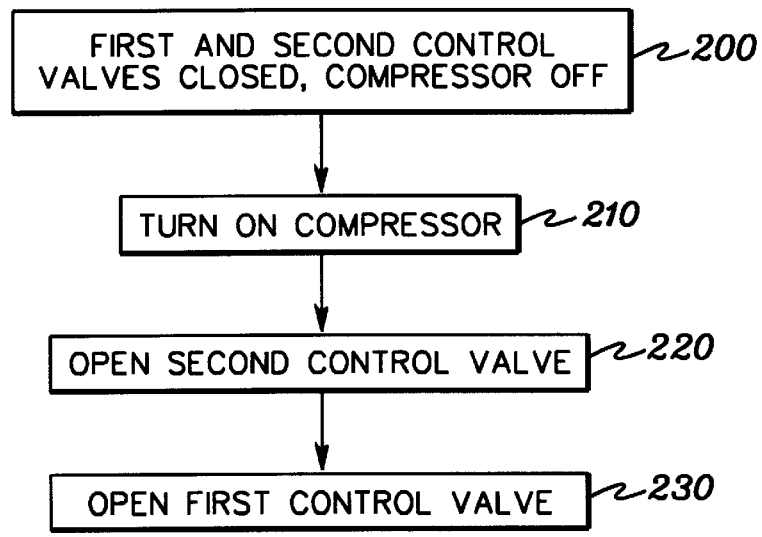
FIG. 7A depicts one embodiment of a system startup procedure in accordance with the principles of the present invention employing the cooling system of FIG. 6.
Figure 7B:
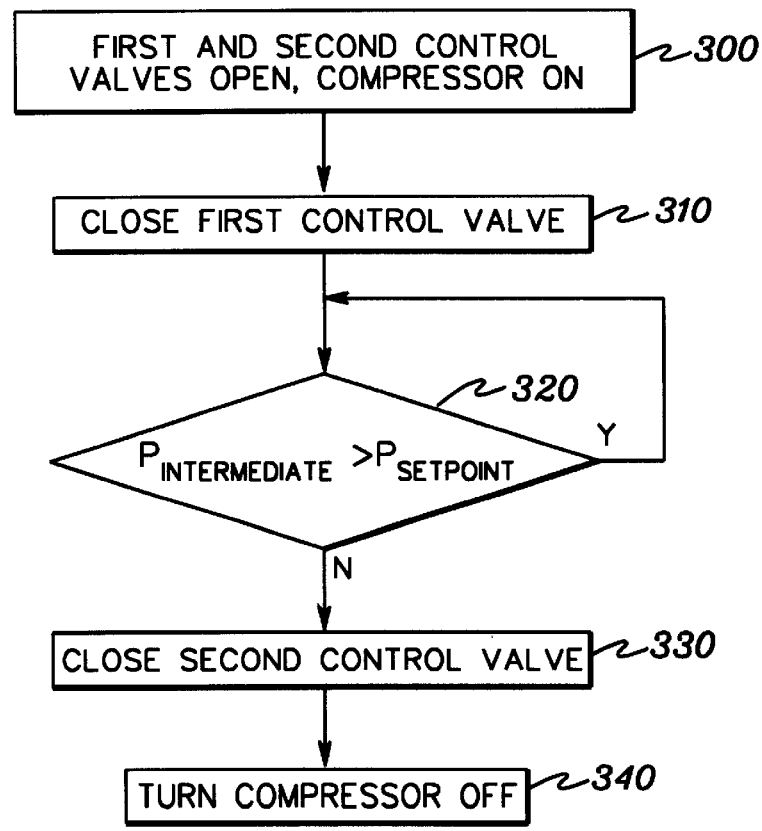
FIG. 7B is a flowchart of one embodiment of a system shut down procedure in accordance with the principles of the present invention employing the cooling system of FIG. 6.

In accordance with one embodiment of the present invention, the coolant comprises refrigerant which is in direct contact with the semiconductor chips to be cooled. Thus, the chip side of the substrate is subjected to refrigerant system pressure, while the pin side of the substrate is subjected to atmospheric pressure. A control approach is desirable to ensure that the chip side of the substrate does not see an excessive pressure or else the substrate may fracture. When a conventional refrigerant system is not running, pressure equalizes within the system in some cases in excess of 100 psi. To prevent this from occurring within the integrated assembly, the startup and shutdown sequences of FIGS. 7A & 7B are preferred. These procedures would be implemented, in one embodiment, by controller 140 of system 100.

FIG. 7A presents a startup procedure. First and second control valves are initially closed and the compressor is off 200. To initiate startup, the controller first turns the compressor on 210 and then opens the second control valve 220. Thereafter, the first control valve can be opened 230. The pressure regulating expansion valve 170 (FIG. 6) ensures that the substrate is not over pressurized during startup by limiting $P_{intermediate}$ (i.e., pressure within the inlet plenum and delivery branch) which in turn limits $P_{low}$ (i.e., pressure within the chip chamber).

FIG. 7B depicts one embodiment of a shutdown sequence in accordance with the present invention. The system is assumed operational with first and second control valves open and the compressor 'on' 300. Shutdown is initiated by first closing the first control valve 310. Processing then waits until $P_{intermediate}$ drops below a predetermined setpoint pressure 320. Once the pressure is below the setpoint, the second control valve is closed 330, and thereafter, the compressor is turned off 340. This sequence of events ensures that pressure is low within the integrated assembly and chamber containing the integrated circuit chips, and that the assembly is isolated from the rest of the system while the closed-cycle cooling system is off.

Those skilled in the art will note from the above discussion that various electronic modules with integrated jet impingement refrigerant evaporator assemblies and a control system therefore are provided herein. Since heat transfer takes place directly between the refrigerant and the semiconductor chips, the assemblies presented can be made out of lightweight, low thermal conductivity materials such as hard plastics. Materials of this type have low thermal capacitance which minimizes initial cool-down time, plus the low thermal conductivity helps to reduce parasitic heat load inherent in low temperature systems. Further, the pressure drops across the jet orifices can easily be higher than conventional pump flow systems. For example, typical centrifugal pumping systems will not tolerate much more than a 10 psi orifice pressure drop. This limits jet velocity and thus heat transfer capability. In a refrigeration system, pressure drops across expansion devices are typically more than 150 psi. This pressure drop can now be proportioned between the expansion device ($P_{high}$ and $P_{intermediate}$) and jet orifices ($P_{intermediate}$ and $P_{low}$) to optimize heat transfer and still attain low refrigerant temperatures.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic module comprising:
    a plurality of heat generating electronic components arrayed on a substrate; and
    a refrigerant evaporator assembly disposed over said plurality of heat generating electronic components, wherein said plurality of heat generating electronic components reside in a chamber between said substrate and said refrigerant evaporator assembly, said refrigerant evaporator assembly being configured to direct coolant onto said plurality of heat generating electronic components, and comprising:
        a lower plate having a plurality of jet orifices, wherein said plurality of jet orifices direct coolant at said plurality of heat generating electronic components, and
        wherein said lower plate further includes a plurality of channels formed between at least some of said plurality of jet orifices, wherein said plurality of channels remove coolant from said chamber after being heated by said plurality of heat generating electronic components.

2. The electronic module of claim 1, wherein said plurality of heat generating electronic components comprises a plurality of integrated circuit chips arrayed on said substrate, and wherein said plurality of jet orifices in said lower plate comprises at least one jet orifice directed at each integrated circuit chip of said plurality of integrated circuit chips.

3. The electronic module of claim 2, wherein said plurality of jet orifices comprises multiple jet orifices directed at at least one integrated circuit chip of said plurality of integrated circuit chips.

4. The electronic module of claim 3, wherein said multiple jet orifices directed at said at least one integrated circuit chip comprises an array of jet orifices directed at each of said at least one integrated circuit chip.

5. The electronic module of claim 4, wherein said array of jet orifices directed at each of said at least one integrated circuit chip comprises a 3×3 array of jet orifices, and wherein said 3×3 array of jet orifices directed at each of said at least one integrated circuit chip delivers coolant fed from a common inlet plenum.

6. The electronic module of claim 1, wherein said plurality of jet orifices comprises a first number of jet orifices directed at a first heat generating electronic component of said plurality of heat generating electronic components, and a second number of jet orifices directed at a second heat generating electronic component of said plurality of heat generating electronic components, wherein said first and second heat generating electronic components generate a different amount of heat, and wherein said first and second number of jet orifices direct more coolant onto either said first or said second heat generating electronic component depending on which requires greater cooling.

7. The electronic module of claim 1, wherein different numbers of jet orifices of said plurality of jet orifices are aligned over different components of said plurality of heat generating electronic components based on individual heat generating capacity of each said heat generating electronic component.

8. The electronic module of claim 1, wherein said lower plate further comprises at least one opening in communication with said plurality of channels, said at least one opening being disposed over a perimeter of said plurality of heat generating electronic components arrayed on the substrate, and functioning as an outlet channel for said coolant removed through said plurality of channels.

9. The electronic module of claim 1, wherein the plurality of heat generating electronic components comprises a plurality of integrated circuit chips arrayed on the substrate, and wherein said plurality of channels formed in said lower plate are disposed in between said plurality of integrated circuit chips, and wherein at least some of said plurality of channels extend over a perimeter of said plurality of integrated circuit chips, and wherein said lower plate further comprises multiple openings in communication with said plurality of channels, said multiple openings being disposed over said perimeter of said integrated circuit chips, and functioning as outlet channels for coolant removed through said plurality of channels.

10. The electronic module of claim 9, wherein said outlet channels feed a common outlet plenum, and wherein said refrigerant evaporator assembly further comprises a common inlet plenum, said common inlet plenum feeding coolant to said plurality of jet orifices in said lower plate, and wherein said common outlet plenum is disposed above said common inlet plenum which is in communication with said plurality of jet orifices.

11. The electronic module of claim 10, further comprising multiple inlets to said common inlet plenum and multiple outlets from said common outlet plenum for feeding coolant into and extracting coolant from, respectively, the electronic module.

12. The electronic module of claim 1, wherein said plurality of channels extend in rows and columns in said lower plate.

13. The electronic module of claim 1, wherein said coolant comprises a refrigerant introduced through said plurality of jet orifices into said chamber and wherein said plurality of channels remove gaseous coolant from said chamber after said refrigerant has been heated by at least one of said plurality of heat generating electronic components.

14. The electronic module of claim 1, further comprising a plurality of thermal spreaders, each thermal spreader being thermally coupled to a heat generating electronic component of said plurality of heat generating electronic components, and wherein said plurality of jet orifices direct coolant at said plurality of thermal spreaders thermally coupled to said heat generating electronic components.

15. The electronic module of claim 1, wherein the refrigerant evaporator assembly directs coolant directly onto a surface of each of said plurality of heat generating electronic components.

16. A coolant carrying assembly for an electronic module having a plurality of heat generating electronic components arrayed on a substrate, said assembly comprising:
 a lower plate having a plurality of jet orifices, wherein said plurality of jet orifices are configured to direct coolant onto said plurality of heat generating electronic components when said assembly is mechanically coupled to said substrate with said plurality of heat generating electronic components residing in a chamber defined between said substrate and said assembly; and
 wherein said lower plate further includes a plurality of channels formed between at least some of said plurality of jet orifices, wherein when in use said plurality of channels remove coolant from said chamber after said coolant is heated by said plurality of heat generating electronic components.

17. The assembly of claim 16, wherein the plurality of jet orifices direct coolant directly onto a surface of each of said plurality of heat generating electronic components.

18. A closed-cycle cooling system for an electronic module comprising:
 a coolant delivery and extraction system having a delivery branch and an extraction branch, a first control valve being located in said delivery branch and a second control valve being located in said extraction branch; and
 wherein said electronic module comprises:
  at least one heat generating electronic component disposed on a substrate; and
  a refrigerant evaporator assembly disposed over said at least one heat generating electronic component, wherein said at least one heat generating electronic component resides in a chamber between said substrate and said refrigerant evaporator assembly, said refrigerant evaporator assembly being configured to direct coolant onto said at least one heat generating electronic component, and having an inlet coupled to said delivery branch and an outlet coupled to said extraction branch; and
 a controller for controlling said first control valve and said second control valve to limit pressure within said chamber when initiating and when discontinuing flow of coolant within said closed-cycle cooling system.

19. The closed-cycle cooling system of claim 18, wherein said coolant delivery and extraction system further comprises a compressor coupled between said delivery branch and said extraction branch, and wherein at startup of said closed-cycle cooling system, said controller comprises means for sequencing startup of said closed-cycle cooling system, said means for sequencing comprising means for first turning on said compressor, means for subsequently opening said second control valve, and means for thereafter opening said first control valve.

20. The closed-cycle cooling system of claim 18, wherein said coolant delivery and extraction system further comprises a compressor disposed between said delivery branch and said extraction branch, and wherein at discontinuance of flow of coolant within said closed-cycle cooling system, said controller comprises means for sequencing shutdown of said system, said means for sequencing shutdown comprising means for closing said first control valve, means for determining whether pressure within said assembly is greater than a predetermined setpoint, and once not, means for closing said second control valve, and means for thereafter turning off said compressor.

21. The closed-cycle cooling system of claim 18, wherein said at least one heat generating electronic component comprises multiple heat generating electronic components disposed on said substrate, and wherein said refrigerant evaporator assembly further comprises a lower plate having a plurality of jet orifices, wherein said plurality of jet orifices direct coolant at said plurality of heat generating electronic components, and wherein said lower plate further includes a plurality of channels formed between at least some of said plurality of jet orifices, wherein said plurality of channels remove coolant from said chamber after being heated by said plurality of heat generating electronic components.

22. The closed-cycle cooling system of claim 21, wherein said plurality of jet orifices comprise multiple arrays of jet orifices, each array of jet orifices being directed to a heat generating electronic component of said plurality of heat generating electronic components.

23. A method for controlling coolant flow within a closed-cycle cooling system coupled to an electronic module, the closed-cycle cooling system including a coolant delivery and extraction system having a delivery branch and an extraction branch, with a first control valve being located in the delivery branch and a second control valve being located in the extraction branch, and with a compressor located between the delivery branch and the extraction branch, and wherein the electronic module includes at least one heat generating electronic component disposed on a substrate, and a refrigerant evaporator assembly positioned over the at least one heat generating electronic component, wherein the at least one heat generating electronic component resides in a chamber between the substrate and the refrigerant evaporator assembly, the refrigerant evaporator assembly being configured to direct coolant onto the at least one heat generating electronic component, and having an inlet coupled to the delivery branch in an outlet coupled to the extraction branch, said method comprising:

controlling pressure within said chamber at startup, wherein said first control valve and said second control valve are closed and said compressor is off at time of startup, said controlling comprising:
(i) turning said compressor on;
(ii) after turning said compressor on, opening said second control valve; and
(iii) after opening said second control valve, opening said first control valve.

24. The method of claim 23, further comprising at shutdown of flow of coolant within said closed-cycle cooling system, said controlling comprises:
(iv) closing said first control valve;
(v) waiting until coolant pressure within said assembly is less than a predetermined setpoint;
(vi) closing said second control valve; and
(vii) after closing said second control valve, turning said compressor off.

* * * * *